United States Patent [19]

Wingate

[11] Patent Number: 4,688,002
[45] Date of Patent: Aug. 18, 1987

[54] AUDIO POWER AMPLIFIER

[76] Inventor: Steven L. Wingate, 423-4th St. S.W., Hickory, N.C. 28602

[21] Appl. No.: 845,630

[22] Filed: Mar. 28, 1986

[51] Int. Cl.⁴ .......................... H02H 7/20; H03F 3/30
[52] U.S. Cl. ................................. 330/298; 330/207 P; 330/264; 330/265; 361/87; 381/55
[58] Field of Search .................... 330/207 P, 264, 265, 330/290, 298; 361/78, 87; 381/55

[56] References Cited

U.S. PATENT DOCUMENTS 4,288,755  9/1981  Sakai .................................. 330/207 P Primary Examiner—James B. Mullins
Attorney, Agent, or Firm—William E. Hein

[57] ABSTRACT

An audio power amplifier employs highly linear power MOSFET gain circuitry that uses distortion cancellation rather than negative feedback to maintain high linearity and to greatly reduce transient intermodulation distortion.

3 Claims, 8 Drawing Figures

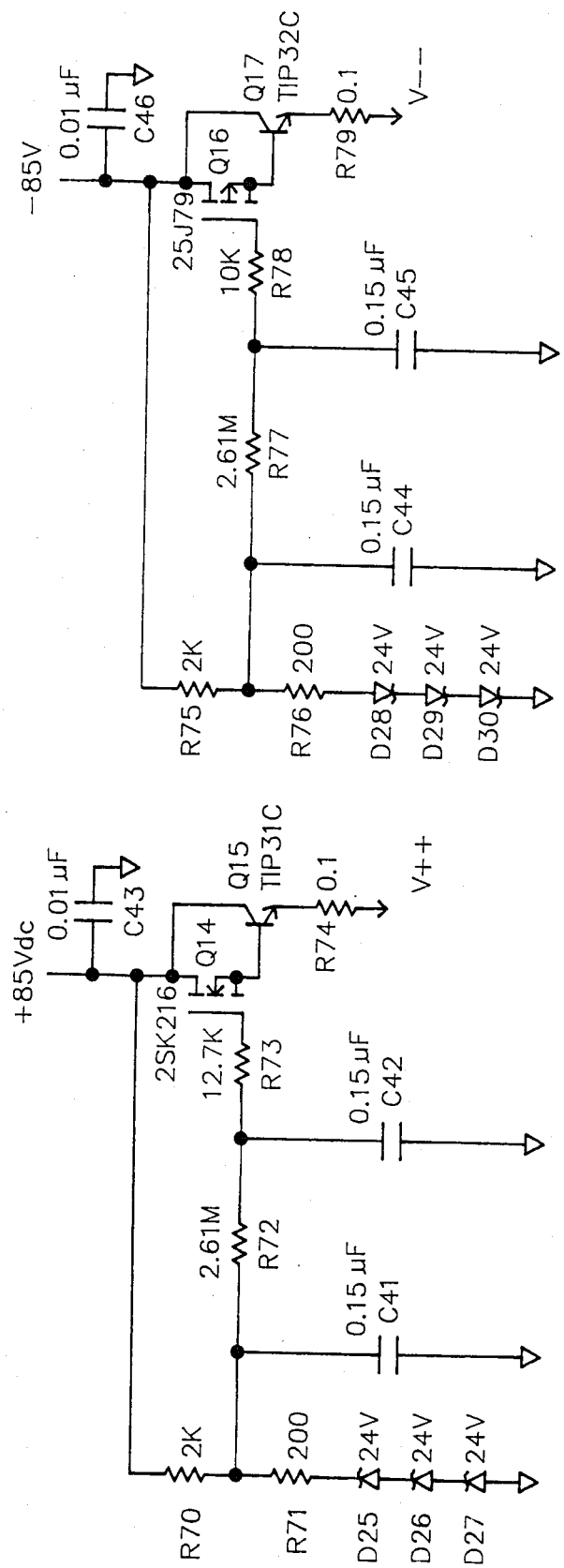
FIG. 3B Negative Regulated Supply
FIG. 3A Positive Regulated Supply

Side View

Cross Section View

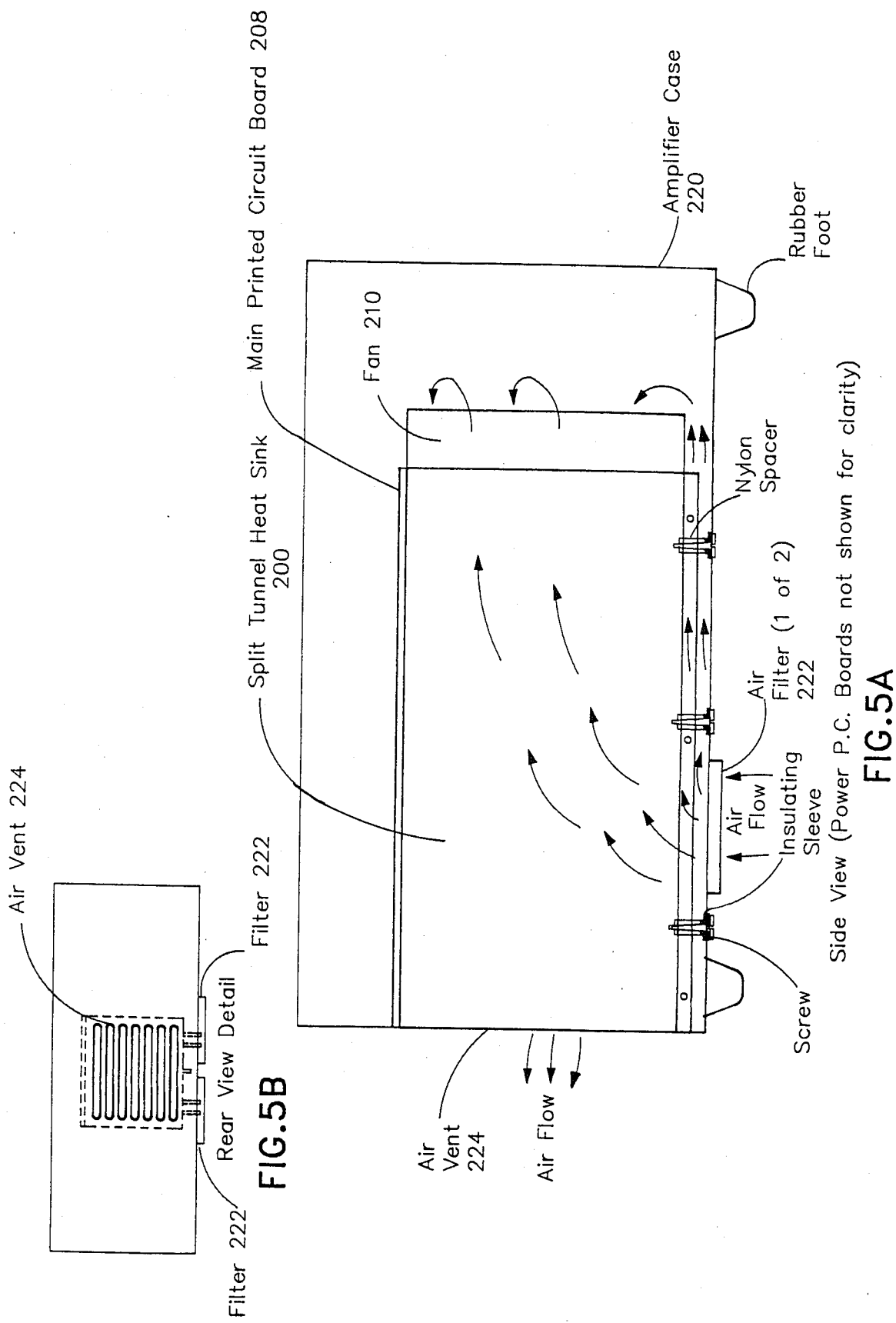

AUDIO POWER AMPLIFIER

BACKGROUND AND SUMMARY OF THE INVENTION

This invention relates generally to audio power amplifiers and more specifically to an audio power amplifier that provides voltage and current amplification without employing overall negative feedback and without employing negative feedback within the voltage gain stages.

Audio power amplification has traditionally been accomplished by designing circuits that employ negative feedback techniques to increase linearity of the output signal. While this approach produces an amplifier which exhibits low distortion when measurements are made using sine wave input signals, these same amplifiers produce audible amounts of Transient Intermodulation Distortion (TIM) when reproducing more complex musical waveforms. The result of TIM is dynamic compression and a great loss of inner detail in the sound. In order to reduce TIM, several manufacturers have designed low-feedback audio power amplifiers. Others have designed amplifiers which employ no overall negative feedback, while retaining local negative feedback because of insufficient linearity within the circuitry. While these techniques, as well as other similar techniques such as feedforward, have reduced TIM, they leave considerable room for improvement. The present design allows for considerably more reduction in TIM due to the total elimination of all forms of negative feedback in all but the final or voltage follower stage of the amplifier. This is possible due to the advanced, highly linear power MOSFET gain circuitry which employs distortion cancellation rather than negative feedback to maintain high linearity. The result is sound reproduction that contains much more inner detail and is considerably more dynamic and transparent than is possible using conventional audio power amplifiers.

DESCRIPTION OF THE DRAWINGS

FIGS. 3A and 3B are detailed schematic diagrams of a positive and a negative power supply that may be employed to provide sources of positive and negative regulated D.C. voltage to power the audio powe amplifier of FIGS. 1 and 2.

FIGS. 5A and 5B are drawings illustrating the mechanical assembly of the split tunnel heat sink within an amplifier case and the resultant direction of air flow within the amplifier case.

DESCRIPTION OF THE PREFERRED EMBODIMENT

Figure 1:
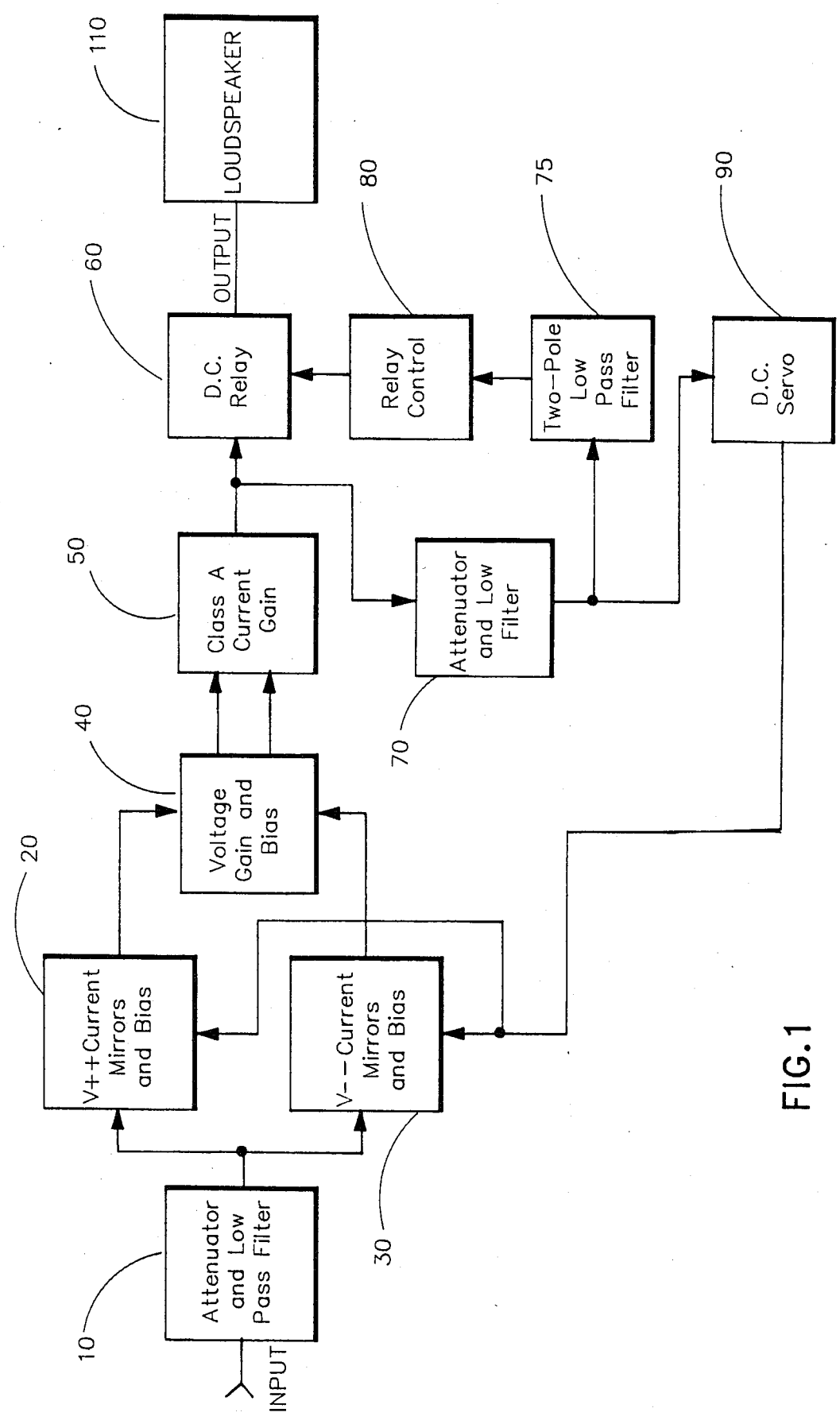
FIG. 1 is a block diagram of an audio power amplifier constructed in accordance with the preferred embodiment of the present invention.

Referring now to FIG. 1, there is shown a block diagram of an amplifier employing an attenuator 10 to reduce the input signal to a level providing proper current swing within the later stages of the amplifier. This attenuator stage, in conjunction with the input capacitance of the following stages, also provides low pass filtering of the input signal, thereby removing out-of-band noise and distortion products. The resultant attenuated and filtered signal is applied to both a V++ current mirrors and bias stage 20 and a V−− current mirrors and bias stage 30, wherein the signal voltage is converted into current swings. The resultant current swings are converted into large signal voltage swings in a voltage gain and bias stage 40. Because of the symmetrical construction of the V++ and V−− current mirrors and bias stages 20 and 30, the non-linearity of the V++ stage 20 is the inverse of the V−− stage 30. When the current swings of the V++ and V−− stages 20 and 30 are combined in the voltage gain and bias stage 40, those nonlinearities cancel each other. This cancellation is limited primarily by the device-to-device uniformity of transfer characteristics of the devices employed in the V++ and V−− stages 20 and 30. In practice, these devices have been found to be quite uniform. In addition to providing current-to-voltage conversion and gain, the voltage gain and bias stage 40 develops a bias voltage to bias a class A current gain stage 50. The class A current gain stage 50 provides current gain for the voltage gain and bias stage 40 in order to drive loudspeaker 110. A relay 60 is provided between the class A current gain stage 50 and the output in order to disconnect the output from the amplifier during turn-on to keep D.C. voltages from destroying the loudspeaker 110. The relay 60 also provides loudspeaker protection from an amplifier failure, dropped stylus, or other failure conditions. The output of the class A current gain stage 50 is applied to an attenuator and low pass filter stage 70. The output of this stage is applied to a two-pole low pass filter stage 75. The resulting signal contains only D.C. and very low frequency A.C. signals. This signal is applied to a relay control stage 80, which acts to sense the amount of D.C. voltage on the output, closing the relay 60 only when the amount of D.C. voltage on the output of the class A current gain stage 50 is acceptably low. The output of the attenuator and low pass filter stage 70 is also applied to a D.C. servo stage 90. D.C. servo stage 90 integrates the D.C. and low frequency A.C. voltage on the output and feeds this signal to the V++ and V−− current mirrors and bias stages 20 and 30. The result is that the D.C. servo stage 90 sends a very low frequency signal to the front end of the amplifier to correct any imbalance in biasing and to reduce the output D.C. voltage to zero. It is important to note that the D.C. servo stage 90 neither senses nor attempts to correct music frequency signals, only very low frequency A.C., as well as D.C. signals.

Figure 2:
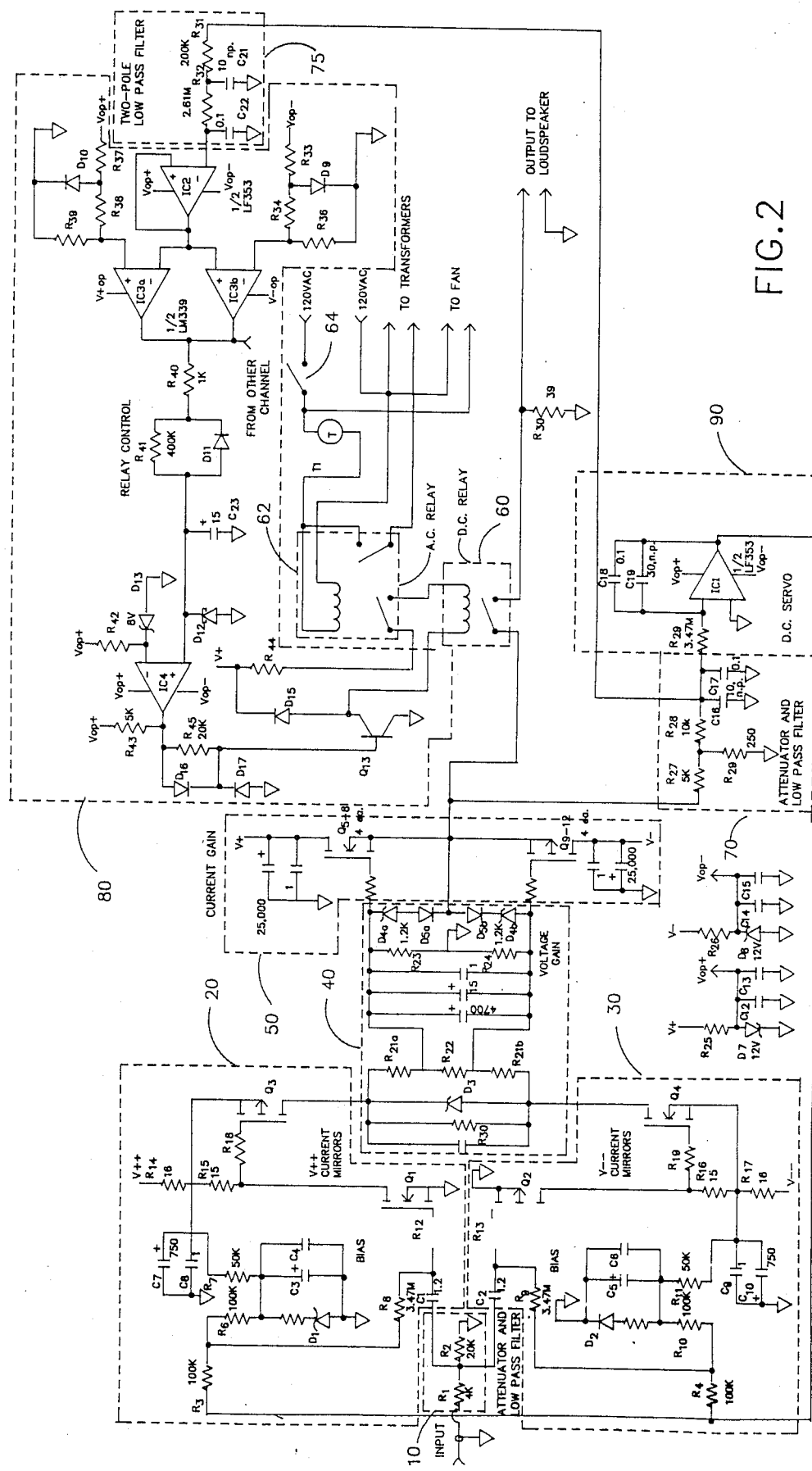
FIG. 2 is a detailed schematic diagram of the audio power amplifier circuitry illustrated in the block diagram of FIG. 1.

Referring now to the detailed schematic diagram of FIG. 2, it is seen that the audio power amplifier of the present invention may be fabricated using standard off-the-shelf components. All active devices may comprise Hitachi complementary power MOSFET transistors, for example. Resistors R1 and R2 comprise a resistive attenuator and, in conjunction with resistors R12 and R13 and the combined gate capacitances of MOSFETS Q1 and Q2, also form a low pass input filter. The combination comprises attenuator and low pass filter 10. This unique arrangement eliminates the need for an input filter capacitor and the resulting problem with dielectric absorption when the charge on such a capacitor crosses zero volts. Capacitors C1 and C2 couple the input signal to MOSFETS Q1 and Q2 and also allow for bias voltages to develop across the gates of Q1 and Q2. These bias voltages are provided by zener diodes D1 and D2. The respective bias voltages are combined with the output of the D.C. servo 90 through resistors R3, R6, R4, R10, and R5 and are fed to the gates of MOSFETS Q1 and Q2 through resistors R8 and R9. Resistors R15 and R16 convert currents in MOSFETS Q1 and Q2 into bias and signal voltages to drive MOSFETS Q3 and Q4. Currents developed in Q3 and Q4 provide a bias voltage across resistor R20 and zener diode D3. This voltage is relatively insensitive to the currents developed in MOSFETS Q3 and Q4. A resistive divider stick comprising resistors R21a, R21b, and R22 divides this voltage down to a lower value, which biases the class A current gain stage 50. Resistors R23 and R24 operate to convert the difference currents between MOSFETS Q3 and Q4 into voltage swings. Diodes D4a, D4b, D5a, and D5b provide gate-source voltage protection for power MOSFETS Q5 through Q12 when these devices do not employ intrinsic gate-source zener diode protection. Power MOSFETS Q5 through Q12 comprise class A current gain stage 50. Since the non-linearities of N-channel MOSFETS Q5 through Q8 are the inverse of the non-linearities of P-channel MOSFETS Q9 through Q12, these non-linearities cancel each other, providing a highly linear output. Thus, both the current mirrors and bias stages 20 and 30 and the class A current gain stage 50 employ distortion cancellation to greatly improve linearity. The small residual non-linearity of the amplifier is of the compression type, which has been found by audio researchers to be the least objectionable form of non-linearity. Resistor R30 provides a constant resistive load at all frequencies in parallel with the loudspeaker 110 thereby greatly reducing the small amount of TIM produced by the class A current gain stage 50. Resistors R27 and R29 comprise a voltage attenuator which divides down the output voltage. This voltage is applied to the low pass filter comprising resistor R28 and capacitors C16 and C17 that is included within attenuator and low pass filter stage 70. The resulting very low frequency A.C. and D.C. components are integrated by the D.C. servo stage 90 that comprises operational amplifier IC1, resistor R29, and capacitors C18 and C19. The output of the D.C. servo stage 90 adds to the bias voltage through resistors R3, R4, R6, R8, R9, and R10 in order to balance the biasing, thus eliminating D.C. voltage from the amplifier circuitry. It should be noted that input capacitors C1 and C2 in combination with resistors R1, R2, R3, R4, R6, R8, R9, and R10 form a low pass filter for the D.C. servo output signal. The two-pole low pass filter stage 75, comprising resistors R31 and R32 and capacitors C21 and C22, receives the output of the attenuator and low pass filter stage 70. The resulting signal is buffered by FET operational amplifier IC2. The buffered output enters a limit sensor formed by comparator IC3a and IC3b, resistors R33, R34, R36, R37, R38, and R39, and diodes D9 and D10. If the input voltage to the limit sensor falls outside the limits defined by resistors R38, R39, R34, and R36 and diodes D9 and D10, the comparator output goes low, quickly opening the D.C. relay 60. Resistors R40, R41, R42, R43, and R45, diodes D11, D12, D13, D16, and D17, and comparator IC4 form a time delay circuit which creates a delay from the time the limit sensor detects an acceptable amount of D.C. on the output to the time the D.C. relay 60 actually closes. This allows the D.C. servo stage 90 to continue to lower the D.C. voltage appearing at the output in the meantime. The result of this unique arrangement is that the limit circuit can be set with higher limits than would otherwise be possible, thereby allowing a larger amount of D.C. voltage at the output before tripping, while still assuring that the D.C. voltage at the output is sufficiently low before the D.C. relay 60 closes, thereby connecting the loudspeaker 110 to the class A current gain stage 50. Diode D11 assures that the D.C. relay 60 opens very soon after the limit sensor detects a D.C. voltage at the output. Diode D17 in combination with resistor R45 assures that when the output of comparator IC4 goes negative, the base of transistor Q13 is only slightly negative, thereby protecting transistor Q13. Diode D16 in combination with resistor R43 assures that when the output of open collector comparator IC4 goes high, only the resistor R43 drives the base of transistor Q13, thereby providing sufficient drive current to saturate Q13. The time delay circuit, plus the three stages of low pass filtering, assures that the relay control circuit 80 is highly insensitive to false tripping due to warped records, high-level bass, etc. The time delay circuit drives transistor Q13 which, in turn, drives the coil of D.C. relay 60. An A.C. relay 62 is used with one of its switches in series with the drive to the D.C. relay 60 so that the D.C. relay 60 will open as soon as A.C. power to the amplifier is lost, thereby protecting the loudspeaker 110 from transients upon turn-off. The A.C. relay 62 is energized through the power switch 64. A thermostat T1 placed on the heat sink interrupts drive to the A.C. relay 62, thereby opening the D.C. relay 60 if overheating occurs. A fan is electrically connected as shown so that the fan continues to run as long as the A.C. power switch is on in the event overheating occurs. A second switch within the A.C. relay 62 switches the A.C. power to the transformers, thereby powering the amplifier circuitry. This allows a power switch with a low current rating to be used while using a heavy duty relay to switch the majority of power instead. Low level power supplies comprising resistors R25, R26, capacitors C12, C13, C14, and C15, and diodes D7 and D8 provide power for the D.C. servo 90 and relay control circuitry 80.

Referring now to FIGS. 3A and 3B, there are shown complimentary positive and negative regulated power supplies that may be employed to provide the V++ and V-- voltages required by the audio power amplifier of FIGS. 1 and 2. Zener diodes D25-D27 form a stable voltage reference circuit for the regulated power supply of FIG. 3A. Resistor R71 and capacitor C41 form a low pass filter which helps remove zener noise from the voltage reference circuit. Resistor R72 and capacitor C42 form an additional low pass filter that acts to provide an extremely pure D.C. reference voltage. Resistor R73 limits the frequency response of power MOSFET Q14 and prevents circuit oscillation. Power MOSFET Q14 is connected to power transistor Q15 in a darlington configuration. Power MOSFET Q14 provides current drive to power transistor Q15 also serves to isolate the high impedance reference voltage across capacitor C42 from power transistor Q15. Resistor R74, together with resistor R14 shown in FIG. 2, provides isolation of the rest of the regulated power supply from capacitors C7 and C8 of FIG. 2 at high frequencies, thereby improving the purity of the sound reproduced by the audio power amplifier. Capacitor C43 provides bypassing of the unregulated 85-volt supply. The foregoing detailed description of FIG. 3A applies to the complementary negative power supply of FIG. 3B.

Figure 4B:
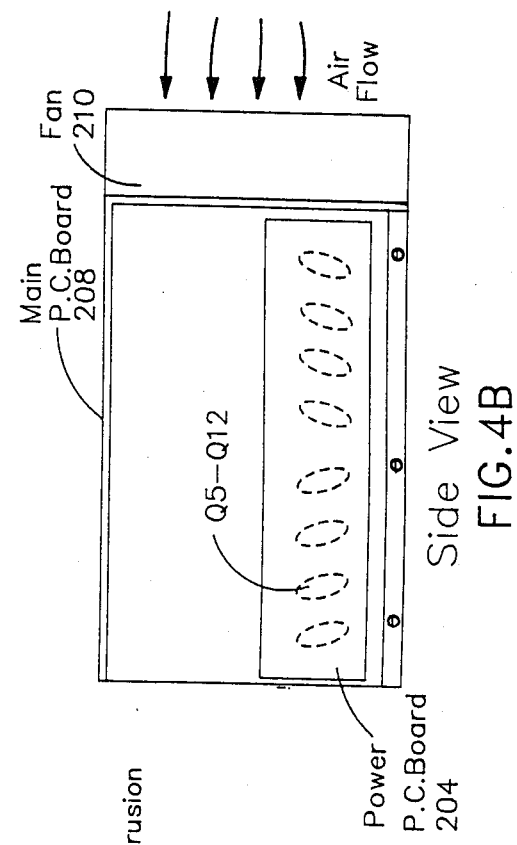
FIGS. 4A and 4B are drawings illustrating the mechanical assembly of the split tunnel heat sink employed in the audio power amplifier constructed in accordance with the present invention.
Figure 4A:
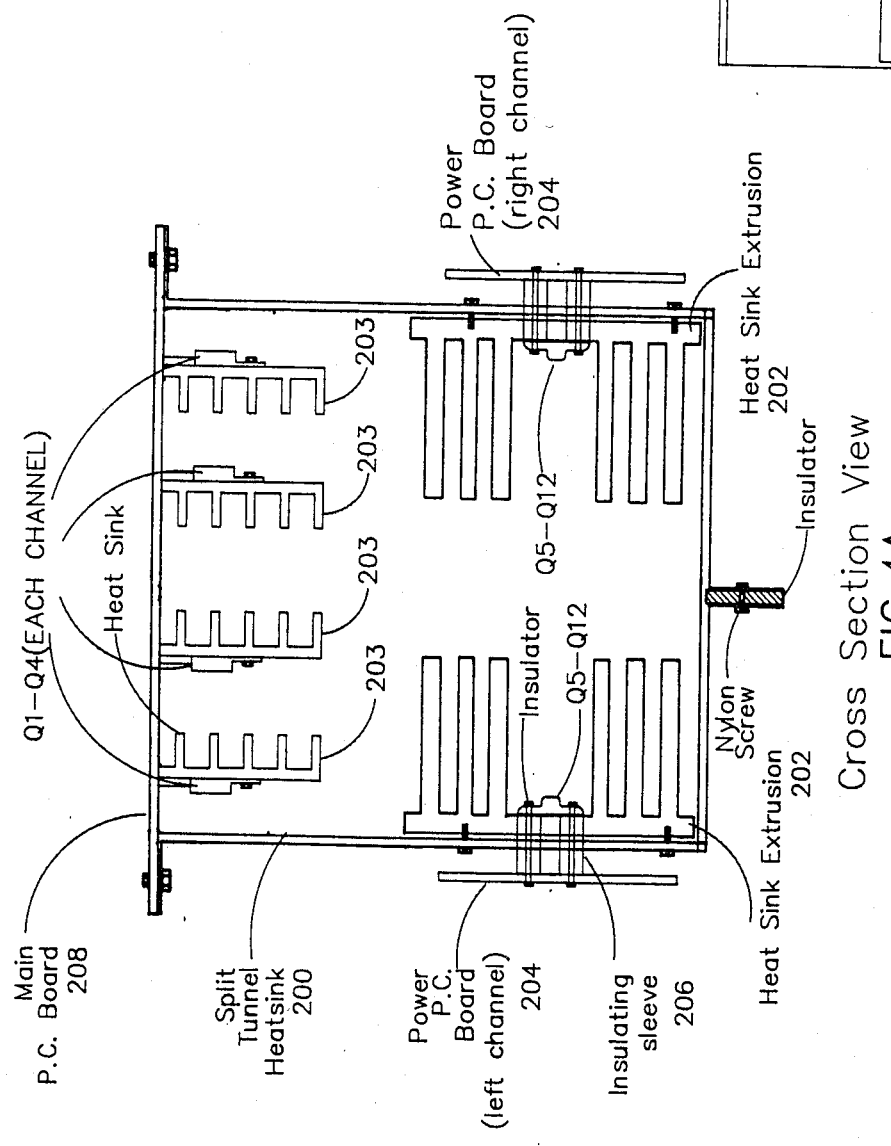

Referring now to FIGS. 4A and 4B, the split tunnel heat sink 200 provides cooling for output MOSFETS Q5 through Q12 (mounted on a power printed circuit board 204), as well as for MOSFETS Q1 through Q4 (mounted on a main printed circuit board 208). Heat sink extrusions 202 are mounted within the split tunnel heat sink 200. MOSFETS Q5 through Q12 for each of the left and right channels of the amplifier are mounted on a pair of heat sink extrusions 202 and are electrically connected, through insulating sleeves 206 to a pair of power printed circuit boards 204 that are mounted on the exterior of split tunnel heat sink 200. The main printed circuit board 208 sits atop the split tunnel heat sink 200 and includes four individual heat sinks 203 on which are mounted MOSFETS Q1 through Q4 for each channel of the amplifier. A fan 210 mounted at one end of split tunnel heat sink 200 provides air flow for cooling. The split tunnel heat sink 200 provides several important advantages. Separate heat sink halves greatly improve producability. In addition, since left and right channels can be stocked as identical units, repair and replacement is simplified. Electrical isolation between left and right channels improves the sound quality of the amplifier. Also, a certain degree of thermal isolation between left and right channels is maintained. Assembly is simplified because of improved access for mounting the power MOSFET devices. As a result of mounting all power MOSFET devices in a similar heat sink enclosure, thermal feedback from output MOSFETS Q5 through Q12 to MOSFETS Q1 through Q4 improves bias stability. Since the transconductance of the MOSFETS used has a negative temperature coefficient, as output MOSFETS Q5 through Q12 heat up, they also heat MOSFETS Q1 through Q4 through convection, thereby lowering their bias which results in lowe bias for output MOSFETS Q5 through Q12. When the amplifier is initially turned on, the MOSFET bias is maximum, quickly heating the MOSFETS to a stable, lower bias point. The thermal coupling through the split tunnel heat sink 200 makes it virtually impossible for any of the MOSFETS to be destroyed by thermal runaway.

Referring now to FIGS. 5A and 5B, the split tunnel heat sink 200 is shown mounted inside an amplifier case 220. An air filter 222 on either side of the split tunnel heat sink 200 allows outside air to enter the amplifier case 220. The arrows show the direction of air flow. The cool air circulates within the amplifier 220 and is pulled into the fan 210, which is mounted at the front end of the split tunnel heat sink 200. The air then flows across the heat sinks 203, thereby cooling MOSFETS Q1 through Q12. The warm air then exits the split tunnel heat sink 200 directly outside the amplifier cas 220 through the air vent 224 on the rear of the amplifier case 220. Since the heated air exits directly outside the amplifier case 220, components mounted on the main and power printed circuit boards external to the split tunnel heat sink 200 such as the capacitors and transformers, remain cool due to the cooling effect of the outside air entering the amplifier case 220.

I claim:

1. An audio power amplifier comprising:
    attenuator and low pass filter means for receiving an input signal, said attenuator and low pass filter means including MOSFET transistor means having a gate-to-source intrinsic capacitance employed as a low pass filter capacitor and being operative for limiting the bandwidth of the input signal, said attenuator and low pass filter means being further operative for limiting the voltage swing of the input signal;
    complimentary current mirror and bias means coupled to said attenuator and low pass filter means for converting an input voltage signal to a current signal and for setting an output D.C. offset voltage;
    voltage gain and bias means coupled to said complimentary current mirror and bias means for transforming said current signal into a large voltage signal;
    class A current gain means coupled to said voltage gain and bias means for providing an output power signal;
    loudspeaker means for receiving the output power signal from said class A current gain means;
    D.C. relay means coupled between said class A current gain means and said loudspeaker means for selectively opening and closing connection between said class A current gain means and said loudspeaker means; and
    relay control means coupled to said D.C. relay means for sensing a threshold level of a D.C. component of said output power signal and for causing said D.C. relay means to open the connection between said class A current gain means and said loudspeaker means at such time as said threshold level is sensed to prevent damage to said loudspeaker means.

2. An audio power amplifier as in claim 1 further comprising A.C. relay means connected to said D.C. relay means for sensing the interruption of A.C. power to the audio power amplifier and for thereupon causing said D.C. relay means to open the connection between said class A current gain means and said loudspeaker means to prevent damage to said loudspeaker means.

3. An audio power amplifier as in claim 1 further comprising:
    second attenuator and low pass filter means coupled to said class A current gain means and said relay control means for filtering a sample of said output power signal for application to said relay control means; and
    D.C. servo means coupled to said second attenuator and low pass filter means and to said complimentary current mirror and bias means for sensing the D.C. content of said output power signal and for providing a D.C. feedback signal to said complimentary current mirror and bias means.

* * * * *